US010115847B2

(12) United States Patent
Zhu et al.

(10) Patent No.: US 10,115,847 B2
(45) Date of Patent: Oct. 30, 2018

(54) CUPRIC OXIDE SEMICONDUCTORS (71) Applicant: Trustees of Tufts College, Medford, MA (US)

(72) Inventors: Changqiong Zhu, Melrose, MA (US); Matthew Panzer, Somerville, MA (US)

(73) Assignee: Trustees of Tufts College, Medford, MA (US)

( * ) Notice: Subject to any disclaimer, the term of this patent is extended or adjusted under 35 U.S.C. 154(b) by 27 days.

(21) Appl. No.: 15/301,646

(22) PCT Filed: Apr. 2, 2015

(86) PCT No.: PCT/US2015/023984
§ 371 (c)(1),
(2) Date: Oct. 3, 2016

(87) PCT Pub. No.: WO2015/153831
PCT Pub. Date: Oct. 8, 2015

(65) Prior Publication Data
US 2017/0025555 A1  Jan. 26, 2017

Related U.S. Application Data (60) Provisional application No. 61/975,428, filed on Apr. 4, 2014.

(51) Int. Cl.
*H01B 1/08* (2006.01)
*H01L 31/06* (2012.01)
(Continued)

(52) U.S. Cl.
CPC .............. *H01L 31/032* (2013.01); *C01G 3/02* (2013.01); *H01B 1/08* (2013.01); *H01G 9/2027* (2013.01); *H01G 11/46* (2013.01); *H01G 11/52* (2013.01); *H01G 11/58* (2013.01); *H01L 31/022425* (2013.01); *H01L 31/06* (2013.01); *H01L 31/18* (2013.01); *H01M 14/005* (2013.01); *C01P 2006/40* (2013.01); *Y02E 10/542* (2013.01)

(58) Field of Classification Search
CPC .. H01B 1/00; H01B 1/08; H01L 31/00; H01L 31/0216; H01L 31/0264; H01L 31/036
See application file for complete search history.

(56) References Cited

U.S. PATENT DOCUMENTS

2006/0070653 A1   4/2006 Elrod et al.
2007/0000537 A1*  1/2007 Leidholm .............. B82Y 10/00
                                                    136/252
(Continued)

FOREIGN PATENT DOCUMENTS

WO    WO-2014-031440    2/2014

*Primary Examiner* — Mark Kopec
(74) *Attorney, Agent, or Firm* — Cesari and McKenna, LLP (57) ABSTRACT

A method of preparing a cupric oxide semiconductor. The method includes providing a substrate having a first surface, forming a cuprous oxide layer on the first surface, converting the cuprous oxide layer into a cupric oxide layer via an oxidation reaction, and depositing additional cupric oxide on the cupric oxide layer, which serves as a seed layer, to yield a cupric oxide film, thereby obtaining a cupric oxide semiconductor. Also disclosed are a cupric oxide semiconductor thus prepared and a photovoltaic device including it.

8 Claims, 5 Drawing Sheets (51) Int. Cl.
*H01L 31/032* (2006.01)
*H01G 9/20* (2006.01)
*C01G 3/02* (2006.01)
*H01G 11/46* (2013.01)
*H01G 11/52* (2013.01)
*H01G 11/58* (2013.01)
*H01L 31/0224* (2006.01)
*H01L 31/18* (2006.01)
*H01M 14/00* (2006.01)

(56) References Cited

U.S. PATENT DOCUMENTS

| | | |
|---|---|---|
| 2009/0072231 A1 | 3/2009 | Tao et al. |
| 2009/0250105 A1 | 10/2009 | Lee |
| 2014/0060639 A1 | 3/2014 | Zeira et al. |

* cited by examiner

CUPRIC OXIDE SEMICONDUCTORS

CROSS REFERENCE TO RELATED APPLICATIONS

This application is the National Stage of International Application No. PCT/US2015/023984, filed on Apr. 2, 2015, which claims the benefit of U.S. Provisional Application No. 61/975,428, filed on Apr. 4, 2014. The contents of both applications are hereby incorporated by reference in their entirety.

BACKGROUND

Cupric oxide (CuO) is an intrinsic p-type semiconductor that has a high capacitance and a strong ability to absorb sunlight.

The degree of crystallinity of CuO is important for its functional role in a particular electronic device. For example, highly crystalline CuO is suitable for photovoltaic devices, e.g., solar cells. Typically, CdTe semiconductors are used in thin film photovoltaic devices in the US. Cd is toxic and Te is rare. By contrast, CuO is safe and abundant, making it an ideal replacement for CdTe.

Of note, CuO, having a low degree of crystallinity, performs better than highly crystalline CuO in energy storage devices such as batteries and supercapacitors. In both photovoltaic devices and energy storage devices, morphologies of the semiconductor also play an important role in determining their electrical and optical properties. See, Osherov et al., *J. Chem. Mater.* 2013, 25, 692-98 and Wang et al., *Appl. Mater. Interfaces* 2014, 6, 1243-50. However, conventional CuO semiconductors do not possess optimized degrees of crystallinity and controllable morphologies. Indeed, no existing methods can be used to prepare CuO semiconductors having both a predetermined degree of crystallinity and a desired morphology.

There is a need to develop CuO semiconductors with predetermined degrees of crystallinity and favorable morphologies for use in electronic devices.

SUMMARY

This invention relates to novel CuO semiconductors that are efficient in absorbing light or have a high capacitance, useful in photovoltaic devices, energy storage devices, and other electronic devices.

One aspect of this invention relates to a method of preparing a CuO semiconductor including the steps of: (i) providing a substrate having a first surface; (ii) forming a cuprous oxide ($Cu_2O$) layer on the first surface; (iii) converting the $Cu_2O$ layer into a CuO layer via an oxidation reaction; and (iv) depositing additional CuO on the nascent CuO layer, which serves as a seed layer, to yield a CuO film, thereby obtaining a CuO semiconductor.

In the above described method, the first surface of the substrate can be electrically conductive. Examples of the substrate include, but are not limited to, a metal (e.g., stainless steel), a metal oxide (e.g., fluorine-doped tin oxide), a glass (e.g., a tin-doped indium oxide-coated glass), an alumina-containing material, and a silicon-containing material.

The $Cu_2O$ layer is typically formed on the first surface to a thickness of 10 nm to 5 μm (e.g., 20 to 200 nm and 30 to 150 nm) via cathodic electrodeposition.

The $Cu_2O$ layer is then converted via oxidization, e.g., by heating it at 300 to 800° C. for 5 to 300 minutes in the air, to a nascent CuO layer, which serves as a seed layer in the subsequent step, i.e., deposition of additional CuO.

Additional CuO can be deposited onto the seed layer via any solution based method, e.g., seed layer-assisted chemical bath deposition (SCBD), in which the CuO seed layer is immersed in a solution that contains cupric ions. Optionally, the solution also contains a dopant and/or a chelating agent. The dopant is incorporated into the CuO film. Examples include $Li^+$, $Ag^+$, $Al^{3+}$, $Mn^{2+}$, $Mn^{4+}$, $Ga^{3+}$, and a combination thereof. The molar ratio between the dopant and the cupric ion in the solution is 0.00001:1 to 0.1:1 (e.g., 0.0001:1 to 0.01:1 and 0.0001:1 to 0.001:1). The chelating agent can be an organic compound that contains a carboxyl group, e.g., a lactate, a citrate, an acetate, a propionate, and a combination thereof. The molar ratio between the chelating agent and the cupric ion is 0.01:1 to 15:1 (e.g., 0.1:1 to 10:1 and 0.5:1 to 5:1). Examples of the chelating agent include sodium lactate, cupric acetate, potassium citrate, and lithium propionate.

After the CuO film is formed, it is optionally annealed at 200 to 800° C. (e.g., 200 to 700° C. and 400 to 500° C.) for 5 minutes to 5 hours (e.g., 30 minutes to 3 hours and 1 to 2 hours).

Another aspect of this invention relates to a CuO semiconductor prepared by the method described above.

Still another aspect of this invention relates to a CuO semiconductor containing a substrate, which is described above, and a CuO film overlaying the substrate, in which the CuO film, containing polycrystalline CuO, amorphous CuO, or both, has an electrical resistivity of 10 to $10^5$ Ω·cm (e.g., 50 to 10,000 Ω·cm and 100 to 1000 Ω·cm), a thickness of 50 to 10,000 nm (e.g., 100 to 5000 nm and 200 to 3000 nm), a bulk density of 1 to 6.4 $g/cm^3$ (e.g., 1.5 to 6.3 $g/cm^3$ and 1.6 to 6.3 $g/cm^3$), a surface area of 1 to 100 $m^2/g$ (e.g., 10 to 80 and 20 to 60 $m^2/g$), a bandgap of 1.1 to 1.8 eV (e.g., 1.1 to 1.6 eV and 1.1 to 1.5 eV), and a capacitance of 50 to 100,000 mF/g (e.g., 100 to 100,000 mF/g and 200 to 100,000 mF/g).

In one embodiment, the CuO semiconductor contains (i) the polycrystalline CuO at O to 100% (e.g., 2 to 98% and 5 to 95%) by weight of the CuO film and (ii) the amorphous CuO at 100 to 0% (e.g., 98 to 2% and 95-5%) also by weight of the CuO film.

The CuO film typically includes a seed layer and a planted layer, in which the seed layer has a first side in contact with the substrate and a second side in contact with the planted layer. The seed layer has a thickness of 10 to 5000 nm and contains dispersed CuO crystals each having a diameter of 10 to 150 nm, and the planted layer has a thickness of 10 to 10,000 nm and contains interconnected nanoplatelets or dendrite spheres of CuO crystals each having a diameter of 10 to 500 nm.

Optionally, the CuO film contains a dopant, which can be $Li^+$, $Ag^+$, $Al^{3+}$, $Mn^{2+}$, $Mn^{4+}$, $Ga^{3+}$, or a combination thereof. The molar ratio between the dopant and the CuO is 0.00001:1 to 0.1:1 (e.g., 0.0001:1 to 0.01:1 and 0.0001:1 to 0.001:1).

Also within the scope of this invention is a photovoltaic device containing a p-type absorber layer formed of the CuO semiconductor described above, a first electrode in ohmic contact with the p-type absorber layer, an n-type layer coated on the CuO film of the semiconductor, and a second electrode in ohmic contact with the n-type layer.

Still within the scope of this invention is an energy storing device that includes a first semiconductor layer formed of the CuO semiconductor described above, a second semiconductor layer, a separator for separating the first semiconductor layer and the second semiconductor layer, and an electrolyte in contact with both layers and capable of passing through the separator.

The details of one or more embodiments of the invention are set forth in the description below. Other features, objects, and advantages of the invention will be apparent from the description and from the claims.

DETAILED DESCRIPTION

Disclosed herein are novel CuO semiconductors each having a predetermined degree of crystallinity and a controllable morphology. Also disclosed is a novel seed layer-assisted chemical bath deposition (SCBD) method for preparing these CuO semiconductors, which can be used in photovoltaic devices or energy storing devices.

Figure 1:
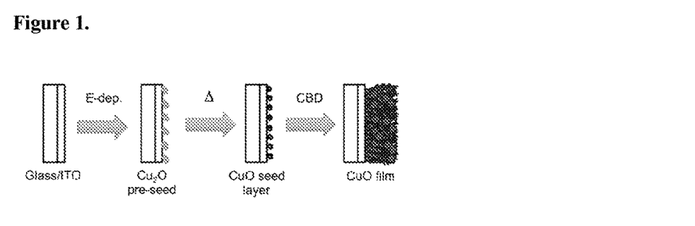
FIG. 1 shows a schematic diagram of a seed layer-assisted chemical bath deposition (SCBD) method of this invention.

FIG. 1 below shows an exemplary schematic diagram of the SCBD method for preparing CuO semiconductors of this invention.

As shown in FIG. 1, a $Cu_2O$ pre-seed layer, i.e., a $Cu_2O$ layer, is first deposited on a substrate, i.e., Glass/ITO, short for a tin-doped indium oxide-coated glass. The deposition can be achieved following known procedures, e.g., (i) thermal oxidation of copper on a copper metal, (ii) reactive radio-frequency magnetron sputtering on a barium borosilicate glass, (iii) spray-pyrolysis on a glass, (iv) molecular-beam epitaxy on a MgO substrate, (v) reactive sputter on a glass, alumina, or fused silica, (vi) reactive laser ablation on a silicon substrate, and (vii) electrodeposition, i.e., "E-dep." as shown in FIG. 1, on a Glass/ITO. See, Matsumura et al., *Jpn. J. Appl. Phys.* 1996, 35, 5631-36; Ishizuka et al., *Jpn. J. Appl. Phys.* 2000, 39, 786-88; Kosugi et al., *J. Am. Ceram. Soc.* 1998, 81, 3117-24; Kawaguchi et al., *J. Crystal Growth* 1994, 143, 221-26; Drobny et al., *Thin Solid Films* 1979, 61, 89-98; Padiyath et al., *Thin Solid Films* 1994, 239, 8-15; and Georgieva et al., *Sol. Energ. Mat. Sol. Cells* 2002, 73, 67-73, respectively.

An electrodeposition method typically employs a three-electrode cell that includes a substrate having a conductive surface (e.g., an ITO-coated glass) as a working electrode, carbon fiber paper as a counter electrode, a reference electrode, and an electrodeposition solution containing cupric ions at a concentration of 0.001 to 5 moles/L (e.g., 0.005 to 1 moles/L and 0.01 to 0.5 moles/L). The three electrodes are immersed in the electrodeposition solution at a pH of 3 to 12 (e.g., 4 to 12 and 4.8 to 12). A potential of 0.1 to −0.8 V (e.g., 0.01 to −0.6 V and 0 to −0.5 V) is applied for a duration of 1 to 3600 seconds (e.g., 3 to 60 seconds and 5 to 40 seconds) to form a $Cu_2O$ layer adhering to the conductive surface of the substrate.

In the electrodeposition, one can control the size of $Cu_2O$ crystals (e.g., 10 to 150 nm) and the thickness of the $Cu_2O$ layer (e.g., 10 to 200 nm) by adjusting the cupric ion concentration, pH, potential, and duration for which the potential is applied to the electrodes.

Subsequently, the $Cu_2O$ layer can be thermally oxidized to form a CuO seed layer (also shown in FIG. 1) at a temperature of 300 to 800° C. for 5 to 300 minutes. The suitable temperature and duration can be readily pre-determined by conducting oxidation experiments at different temperatures for various durations. Transformation of $Cu_2O$ to CuO can be confirmed by scanning electron microscope mages (SEM), optical transmittance spectra, or X-ray photoelectron spectroscopy (XPS). See the "Characterization of Semiconductors" section below. Typically, heating the $Cu_2O$ layer at 450° C. for 15 minutes completely converts it into a CuO layer, which serves as a seed layer for further processing.

As shown in FIG. 1 above, additional CuO can be deposited onto the seed layer via a solution-based method, e.g., SCBD, hydrothermal deposition, reflux deposition, and electrodeposition, as well as a solid-state reaction. See Bayansal et al., *Ceram. Int.* 2012, 38, 1859-66; Zhang et al., *Mater. Lett.* 2008, 62, 385-88; Gervasini et al., *Chem. Mater.* 2007, 19, 1319-28; Kothari et al., *Chem. Mater.* 2004, 16, 4232-44; and Xu et al., *J. of Solid State Chem.* 1999, 147, 516-19, respectively. A CuO semiconductor thus obtained contains a CuO film, which includes a seed layer and a planted layer formed of the additional CuO deposited on the seed layer.

As an example, the substrate having the seed layer described above can be immersed in a SCBD aqueous solution containing one or more cupric salts (e.g., $CuCl_2$, $CuSO_4$, $CuNO_3$, cupric tartrate, cupric acetate, cupric citrate, and a combination thereof). More specifically, after adjusting the pH to 7 to 12 (e.g., 8 to 11 and 9 to 10.5), the substrate is placed in the SCBD aqueous solution, which is heated from room temperature at a rate of 1 to 20° C./minute (e.g., 2 to 18° C./minute and 2.5 to 15° C./minute) to a temperature of 60 to 110° C. (e.g., 75 to 105° C. and 80 to 100° C.). The solution is then held at the temperature for a period of 0 to 60 minutes (e.g., 2 to 30 minutes and 3 to 20 minutes) to yield a planted CuO layer containing CuO crystals. One can control the properties of the planted layer (e.g., thickness of the planted layer, size of the crystals, degree of crystallinity, and morphology) by choosing a suitable cupric salt, adjusting the pH or concentration of the cupric salt, or varying the temperature/heating rate/heating period.

Also, a chelating agent can be added to the SCBD solution to optimize the properties of the planted layer, e.g., the degree of the crystallinity and morphology. To obtain a predetermined degree of crystallinity, one can use a specific molar ratio between the chelating agent and the cupric ion in the SCBD solution. Further, adding a chelating agent also results in change of morphology, e.g., from an interconnected nanoplatelet morphology to a dendritic (e.g., dendrite sphere) morphology. Changing the degree of crystallinity and morphology in return lead to changes in optical properties (e.g., bandgap) and electrical properties (e.g., capacitance and electrical resistivity) of the CuO semiconductor thus prepared.

Moreover, a dopant can also be added to the SCBD solution to change the electrical resistivity of the CuO semiconductor thus obtained. As an example, a metal salt (e.g., LiCl, LiNO$_3$, and NaCl) is used as a dopant so that the metal ion contained in the SCBD solution is deposited in the CuO film along with the additional CuO planted on the CuO seed layer as described above. Alternatively, the dopant can be drop-casted on the CuO film followed by an annealing step at a temperature of 200 to 800° C. (e.g., 300 to 750° C. and 350 to 700° C.) for a period of 0.5 to 5 hours (e.g., 1 to 4 hours and 1.5 to 3 hours).

A CuO film that does not have any dopant can also be annealed at the above-mentioned temperature for the same duration. Annealing both the doped and undoped CuO films results in changes of the degree of crystallinity, morphology, bandgap, capacitance, or electrical resistivity.

The specific examples below are to be construed as merely illustrative, and not limitative of the remainder of the disclosure in any way whatsoever. Without further elaboration, it is believed that one skilled in the art can, based on the description herein, utilize the present invention to its fullest extent. All publications cited herein are incorporated by reference in their entirety.

Preparation of CuO Semiconductors

Four CuO semiconductors, i.e., ITO-1 to ITO-4, were prepared following the procedures described below.

Example 1: Preparation of ITO-1

A CuO semiconductor of this invention, i.e., ITO-1, was obtained using the below SCBD method.

Preparation of a Cu$_2$O Pre-Seed Layer

An ITO-coated glass (17 mm×31 mm; Thin Film Devices, Inc.) was used as a transparent conductive substrate, which had a thickness of 1.09 mm and contained an ITO film (thickness 150 nm and resistivity 20 Ω/sq.).

The ITO-coated glass was cleaned by successive sonication in Micro-90® (2 vol % in water), water, and acetone, and then immersion in boiling isopropanol. After being dried under flowing nitrogen gas, it was placed in a conventional three-electrode cell using ITO as the working electrode, carbon fiber paper as the counter electrode, Ag/AgCl (3 M NaCl solution) as the reference electrode, and an electrode-position aqueous solution (0.4 M CuSO$_4$; 3 M sodium lactate; and the pH of which was adjusted to 12 by adding NaOH solution). A Cu$_2$O layer was deposited at 60° C. in potentiostatic mode using a VersaSTAT 3 potentiostat (Princeton Applied Research) with a potential of −0.4 V vs. Ag/AgCl for 10 seconds. The Cu$_2$O layer thus deposited was thoroughly rinsed with water and dried under flowing nitrogen gas.

Formation of a CuO Seed Layer

To convert the Cu$_2$O pre-seed layer thus prepared into a CuO seed layer, the Cu$_2$O-coated ITO glass was placed (glass side down) onto a preheated hotplate (Fisher Scientific, Isotemp™ model 11-102-16SH) in the air and heated to 450° C.

Four CuO seed layers, i.e., Seed-1 to Seed 4, were prepared to determine the minimum time needed to completely oxidize the Cu$_2$O to CuO. Namely, Seed-1 was prepared by heating the Cu$_2$O layer at 450° C. for 2.5 minutes, Seed-2 for 5 minutes, Seed-3 for 15 minutes, and Seed-4 for 90 minutes.

SEM images of the Cu$_2$O layer, Seed-1, Seed-2, and Seed-3 were obtained. See FIG. 2 below.

Figure 2:
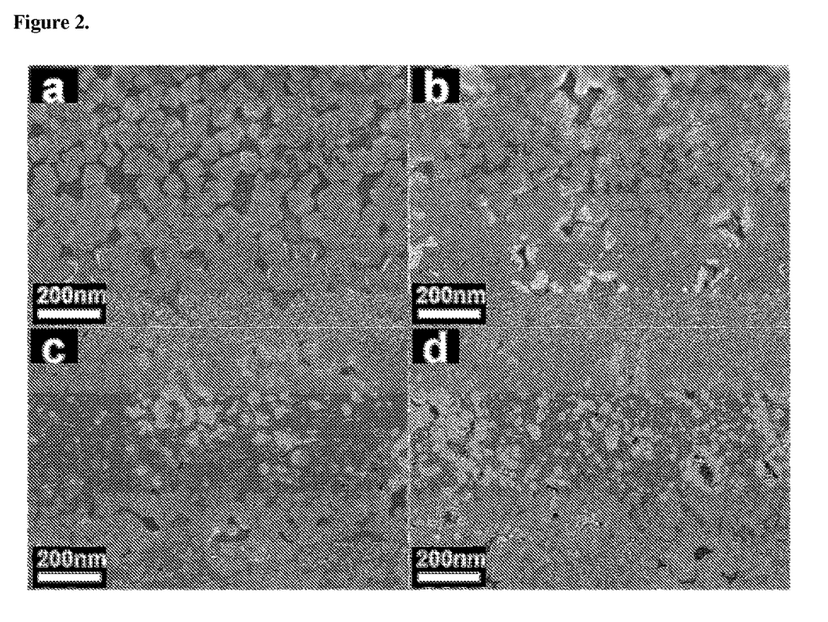
FIG. 2 shows scanning electron microscope mages (SEM) of a $Cu_2O$ layer and three CuO seed layers, i.e., Seed-1, Seed-2, and Seed-3.

As shown in FIG. 2(a), the size of the Cu$_2$O crystallites is about 80 nm. This small size enables rapid oxidation of Cu$_2$O into CuO. After being heated for 2.5 minutes, the Cu$_2$O pre-seed layer exhibits a dramatic morphology change, as shown in FIG. 2(b). The original Cu$_2$O crystallites start to reform into even smaller CuO crystallites. Even though a substantial number of Cu$_2$O crystallites are present in FIG. 2(c), one can still easily discern the shape of the Cu$_2$O crystallites, which indicates that the conversion of Cu$_2$O to CuO is not complete within 5 minutes.

After 15 min of heating, nano-scale CuO crystallites with an approximate diameter of 30 nm can be seen in FIG. 2(d). At this stage, the original Cu$_2$O crystallite shapes have completely disappeared.

Figure 3:
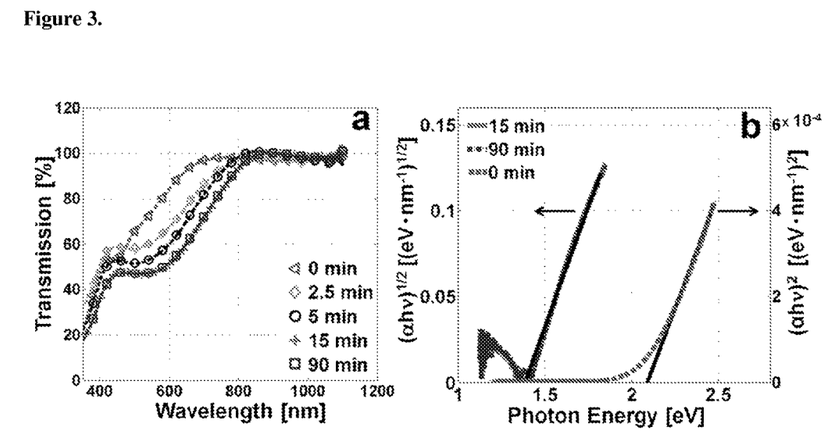
FIG. 3 shows (a) transmittance spectra of a $Cu_2O$ layer and four CuO seed layers, i.e., Seed-1 to Seed-4, and (b) corresponding Tauc plots to determine the bandgap values for the $Cu_2O$ layer, Seed-3, and Seed-4.

The transmittance spectra of the Cu$_2$O pre-seed layer and Seed-1 to Seed-4 were collected using the method described below. The spectrum of Seed-3 is identical to that of Seed-4, indicating that heating for 15 minutes is sufficient to completely convert the Cu$_2$O pre-seed layer into a CuO seed layer. See FIG. 3(a) below. In addition, Tauc plots were prepared to obtain the bandgap value for each of the Cu$_2$O layer, Seed-3, and Seed-4. See FIG. 3(b). More specifically, the quantities $(\alpha h\nu)^2$ and $(\alpha h\nu)^{1/2}$ were plotted as a function of photon energy (hν) for Cu$_2$O and CuO, respectively, due to the direct vs. indirect nature of their bandgaps. Bandgap values extracted from the y-intercepts of the Tauc plots are: 2.10 eV, 1.38 eV, and 1.38 eV for the Cu$_2$O layer, Seed-3, and Seed-4, respectively.

The transformation of Cu$_2$O to CuO during the heating process is also confirmed by the XPS data (Cu 2p and C 1s photoelectron spectra) shown in FIG. 4 below. The main peak in the Cu 2p spectrum (932.4 eV) of the Cu$_2$O layer (i.e., Seed 0 min shown in FIG. 4, left panel) corresponds to Cu$^+$, and the shoulder peak (934.8 eV) corresponds to Cu$^{2+}$ in CuCO$_3$ stabilized by Cu(OH)$_2$. See FIG. 4, left panel. After being heated for 15 minutes, the new position of the dominant peak (933.6 eV) corresponds to Cu$^{2+}$ in CuO of Seed-3 (i.e., Seed 15 min shown in FIG. 4, left panel). The two strong shake up peaks at 941.3 eV and 943.7 eV also belong to CuO.

Also shown in FIG. 4 (left panel) are the Cu 2p spectra of two CuO semiconductors ITO-1 and ITO-3 described below. Both of them show shapes identical to those of Seed-3, i.e., pure CuO without Cu$_2$O, indicating that these two semiconductors of this invention are free of Cu$_2$O.

Figure 4:
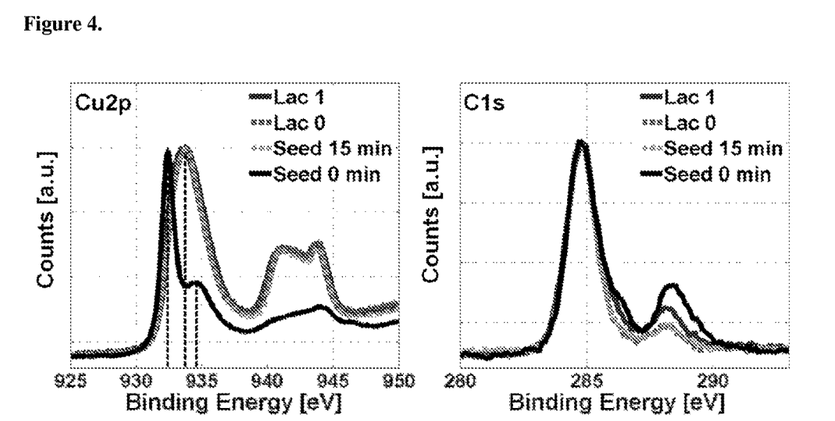
FIG. 4 shows X-ray photoelectron spectroscopy (XPS) copper 2p (Cu 2p; left panel) and carbon is (C is; right panel) spectra of a $Cu_2O$ layer, Seed-3, and two CuO semiconductors of this invention, i.e., ITO-1 and ITO-3.

Turning to the C 1s spectra in FIG. 4 (right panel), Seed-3 and ITO-1 each have an identical spectrum, different from that of the Cu$_2$O layer. Note that ITO-3 shows two peaks, i.e., 286.26 eV (C—OH) and 288.29 eV (O—C═O), which belong to lactate molecules present in the electrodeposition solution used to prepare ITO-3, but not ITO-1.

Seed Layer-Assisted Chemical Bath Deposition of CuO

Figure 5:
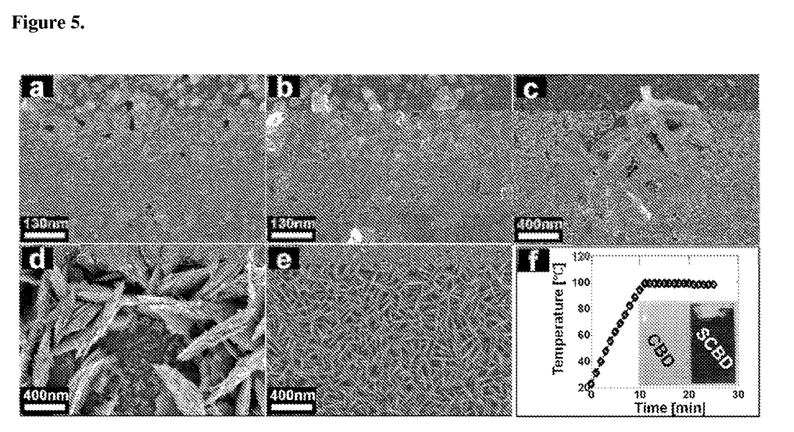
FIG. 5 shows SEM images of various stages of CuO film growth: (a) CuO seed layer; (b)-(d) CuO films of samples removed from the SCBD solution prior to spending a full 15 minutes at the boiling point; (e) final CuO film topography (held for 15 minutes at the boiling point); (f) solution temperature versus time measured during SCBD CuO deposition; and (inset) photographs of (i) an unseeded ITO substrate after being immersed in a chemical bath deposition solution for 15 minutes (left image) and (ii) a CuO-seeded ITO substrate after being immersed in a SCBD solution for 15 minutes (right image; i.e., ITO-1 of this invention).

To deposit additional CuO on the CuO seed layer, 0.019 M $CuCl_2$ was used as the SCBD solution (190 mL), the pH of which was adjusted to 10 by adding ammonium hydroxide solution in a dropwise manner. The CuO-seeded ITO substrate obtained above was placed CuO side up in a Teflon holder that maintained a substrate angle of 30° from vertical during the deposition. The substrate was completely immersed in the SCBD solution in a beaker, which was covered by a watch glass, heated on a hotplate from room temperature to the solution boiling point (i.e., 100° C.) at a rate of 7.5° C./minute. See FIG. 5(f) below for the temperature vs. time profile.

The solution was maintained at a steady boiling condition for 15 minutes to allowed CuO to deposit onto the CuO seed layer. After being removed from the solution and cooled to room temperature, the CuO film thus obtained was rinsed with water, subsequently sonicated in water for 20 minutes to remove any non-adherent particulates in a Branson 2510 2.8 L ultrasonicator, and then dried under flowing nitrogen gas to yield CuO semiconductor ITO-1 containing a 1 μm thick CuO film adhering to the ITO-coated glass substrate.

To understand how the CuO film morphology develops, SEM imaging was performed on a CuO intermediate film obtained from immersing a CuO seed layer in the boiling SCBD solution for one minute, as shown in FIG. 5 below. FIG. 5(a) shows the morphology of the initial CuO seed layer, FIGS. 5(b)-(d) show the morphology of CuO intermediate films at various stages of film growth, and FIG. 5(e) shows the morphology the CuO film contained in semiconductor ITO-1. During the deposition of CuO, CuO nanoparticles (~30 nm in diameter) first grow on top of the original CuO seeds as shown in FIG. 5(b); the CuO nanoparticle growth results in the surface of ITO becoming fully covered by CuO. Next, these primary nanoparticles begin to aggregate together to form larger, crossed nanoplatelets (~400-600 nm across), as shown in FIG. 5(c). Eventually, the nanoparticles continue to accumulate on the nanoplatelets, which further aggregate until complete, nanoplatelet-covered CuO films are formed, as shown in FIG. 5(e). It is unexpected that, at the final stage of film growth, the platelets become thin and much smaller, and form interpenetrating platelet morphology. Note that the solution temperature changes during the deposition are shown in FIG. 5(f).

Further, ITO-1, as well as ITO-2, ITO-3, and ITO-4 described below, was subjected to an X-ray diffraction analysis, an optical transmittance spectroscopy analysis, an X-ray photoelectron spectroscopy analysis, and an electrical resistivity measurement, all of which are described below. The results are shown in below FIGS. 6-9.

Comparative CBD Coating

An ITO-coated glass substrate without a CuO seed layer was subjected to a chemical bath deposition process using the same SCBD solution described above under the same conditions except that no CuO-seeded ITO-coated glass substrate was used. No adherent CuO film was formed on the ITO-coated glass substrate, as shown on the left side of the inset photograph in FIG. 5(f).

By contrast, when a CuO-seeded substrate was used, an approximately 1 micron thick, dark-colored CuO film was unexpectedly deposited on the ITO-coated glass substrate (see the photograph in FIG. 5(f), right).

Examples 2-4: Preparation of ITO-2, ITO-3, and ITO-4

Three CuO semiconductors of this invention, i.e., ITO-2, ITO-3, and ITO-4, were also prepared.

ITO-2 was prepared following the procedure described above in Example 1 except that sodium lactate was added to the SCBD solution along with $CuCl_2$, followed by adjusting the pH value of the solution to 10 by adding 50% NaOH aqueous solution. The molar ratio between sodium lactate and $CuCl_2$ was 0.4:1.

ITO-3 was prepared following the procedure used to prepare ITO-2 except that The molar ratio between sodium lactate and $CuCl_2$ was 1:1.

ITO-4 was prepared following the procedure used to prepare ITO-2 except that The molar ratio between sodium lactate and $CuCl_2$ was 1.2:1.

These three semiconductors were subjected to SEM imaging, an X-ray diffraction analysis, an optical transmittance spectroscopy analysis, an X-ray photoelectron spectroscopy analysis, and an electrical resistivity measurement described below. The results are shown in FIGS. 6-9.

Characterization of CuO Semiconductors

The four semiconductors prepared in Examples 1-4 above, i.e., ITO-1 to ITO-4, were subjected to the following analyses.

Scanning Electron Microscopy

Scanning electron microscopy (SEM, Zeiss FESEM Ultra Plus) was used to characterize film morphology of ITO-1 to ITO-4. See FIG. 6 below.

Figure 6:
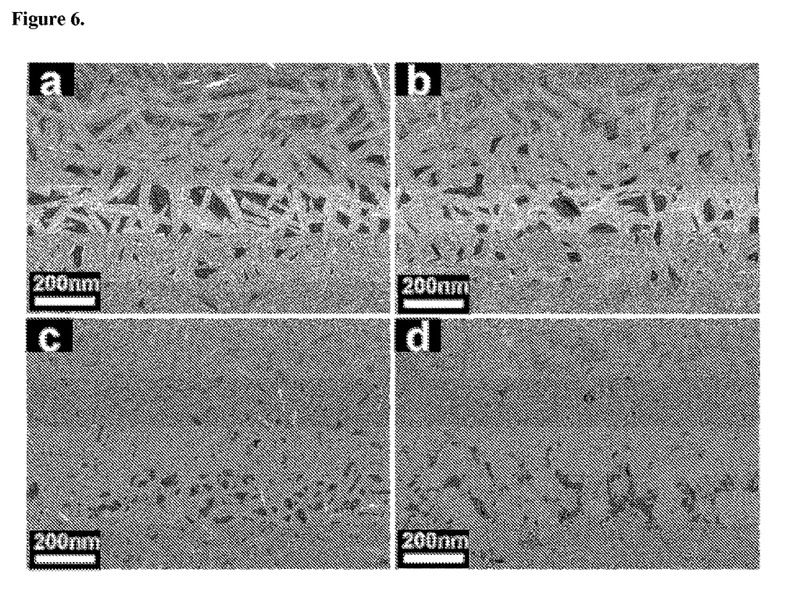
FIG. 6 shows SEM images of four semiconductors of this invention, i.e., (a) ITO-1, (b) ITO-2, (c) ITO-3, and (d) ITO-4.

As shown in FIG. 6(a), the CuO film grown from the SCBD solution without any lactate (i.e., ITO-1) exhibits a high degree of crystallinity, interpenetrating platelet morphology. FIG. 6(b) shows the SEM image of ITO-2, which was prepared using the SCBD solution containing sodium lactate (lactate/copper molar ratio=0.4:1). The platelet structure can still be seen, but the platelet edges become thinner and sharper. Additionally, some amorphous material is present in between the platelets. This trend is even more dramatic for ITO-3, which was grown from the SCBD solution containing sodium lactate at a higher lactate/copper molar ratio, i.e., 1:1. See FIG. 6(c). As to ITO-4 prepared from the SCBD solution containing even higher concentration of sodium lactate (lactate/copper molar ratio, 1.2:1), the CuO morphology changes to a dense, dendritic film having sphere-like structures approximately 100 nm in diameter. See FIG. 6(d). Note to be bound by any theory, one explanation for this behavior is the sequestration of a larger fraction of $Cu^{2+}$ in metal ion complexes with increasing lactate concentration, resulting in a different CuO precipitation/growth mechanism.

The SEM images show that, by adding different amounts of sodium lactate into the SCBD solution, unexpectedly, one can change the degree of crystallinity and/or morphology of the CuO film.

Optical Transmittance Spectra

Figure 7:
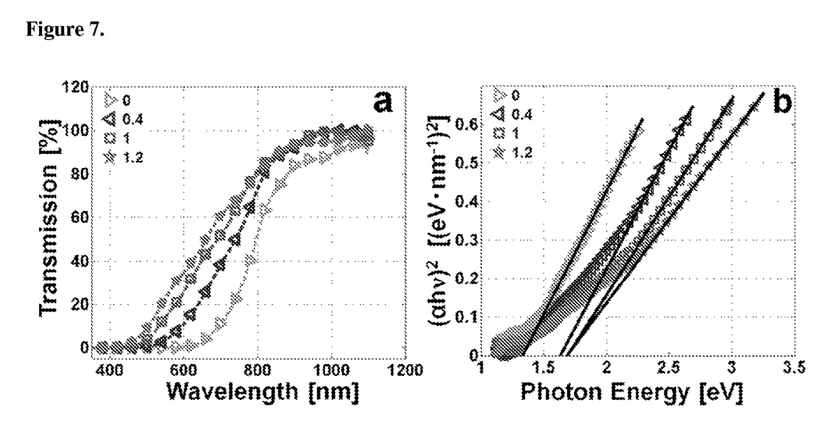
FIG. 7 shows (a) transmittance spectra of Semiconductors ITO-1, ITO-2, ITO-3, and ITO-4, and (b) corresponding Tauc plots to determine the bandgap value of each semiconductor.
Figure 8:
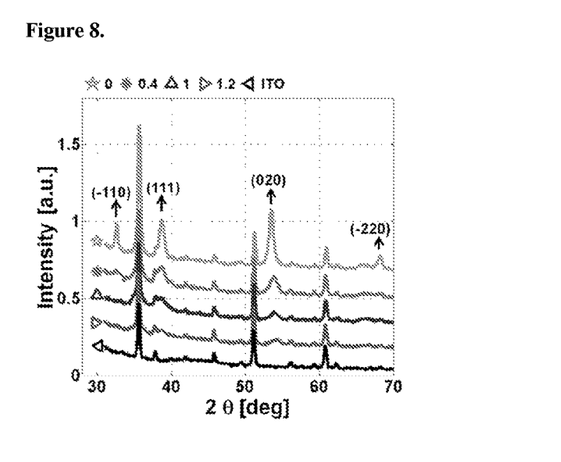
FIG. 8 shows X-ray diffraction (XRD) spectra of an ITO-coated glass, ITO-1, ITO-2, ITO-3, and ITO-4.

Optical transmittance spectra of ITO-1 to ITO-4 were collected using an Agilent Cary 60 UV-Vis spectrophotometer. See FIG. 7(a) below. A reference spectrum from the bare ITO/glass substrate was subtracted from all sample spectra.

In order to obtain bandgap values for the films in each of ITO-1 to ITO-4, the absorption-photon energy product in the form of $(\alpha h\nu)^2$ was plotted as a function of photon energy ($h\nu$). See FIG. 7(b) below.

The bandgap values for ITO-1, ITO-2, ITO-3, and ITO-4 were determined to be: 1.33 eV, 1.63 eV, 1.68 eV, and 1.68 eV, respectively. See FIG. 7(b). Amorphous films in general possess larger bandgaps than highly crystalline films. See Rotaru et al., *Phys. Stat. Sol.* 1999, 171, 365-70; Cody et al., *Phys. Rev. Lett.* 1981, 47, 1480-83; and Bahl et al., *J. Appl. Phys.* 1970, 41, 2196-2212. The bandgaps suggest that increasing the lactate concentration in the SCBD solution leads to a CuO film with a greater amorphous character. Moreover, the absorption edges for a film grown from a solution containing a lower lactate concentration (or no lactate) are sharper, indicating that the film is more crystalline.

Note that, despite a widening of the bandgap for a CuO film grown in the presence of lactate, each of ITO-1 to ITO-4 contains pure CuO, not $Cu_2O$ or a mixture of CuO and $Cu_2O$. This was also verified by examining the Cu 2p XPS spectra (see in FIG. 4 above), which show identical shapes for both the film grown with and without lactate present, i.e., ITO-3 and ITO-1, X-Ray Diffraction X-ray diffraction (XRD) data were collected for ITO-1 to ITO4 using a Bruker D8 X-ray diffractometer with Cu Kα radiation to verify the phase and degree of crystallinity of the deposited films. See FIG. 8 below. The ITO-coated glass spectrum is also shown in this figure for reference.

The XRD spectra show that the degree of CuO crystallinity can be tuned by adding sodium lactate as a chelating agent in the SCBD solution. ITO-1 (shown as 0 in FIG. 8), grown from the SCBD solution without any lactate, shows several sharp diffraction peaks not assigned to the ITO-coated glass (i.e., ITO in FIG. 8), indicating a high degree of crystallinity. The peak positions match the JCPDS reference code 00-045-0937, which reveals that the CuO films contain tenorite, belonging to the monoclinic crystal system. No additional impurity peaks are detected. Unexpectedly, after adding sodium lactate into the SCBD solution (sodium lactate/cupric chloride molar ratio=0.4:1 for ITO-2; shown in FIG. 8 as 0.4), the shapes of the XRD peaks change dramatically. All of the peaks corresponding to CuO in ITO-3 (shown in FIG. 8 as 1) and ITO-4 (shown in FIG. 8 as 1.2) become substantially weaker and broader, indicating a more amorphous film character. In ITO-4 spectrum, the peaks corresponding to CuO can barely be discerned. Therefore, an advantage of the SCBD process described herein is the ability to prepare not only highly crystalline CuO films on ITO-coated glass (e.g., for photovoltaic applications), but also the ability to create more amorphous CuO films with highly dendritic morphologies (e.g., for battery or pseudo-capacitor electrodes) simply by adding a chelating agent such as sodium lactate into the SCBD solution.

X-Ray Photoelectron Spectroscopy

X-ray photoelectron spectroscopy (XPS) was conducted on a $Cu_2O$ layer, Seed-3, ITO-1, and ITO-3, using a Thermo Scientific K-Alpha XPS with a monochromatic Al X-ray source (excitation energy 1486.6 eV). The XPS data were calibrated by the position of the primary C1s peak at 284.80 eV. The results are shown in FIG. 4 above, confirming that Seed-3, ITO-1 and ITO-3 each contain pure CuO, but not $Cu_2O$.

Cyclic Voltammogram

The potential of both ITO-1 and ITO-3 to serve as a redox active electrode was observed using cyclic voltammetry in a three-electrode setup.

Figure 9:
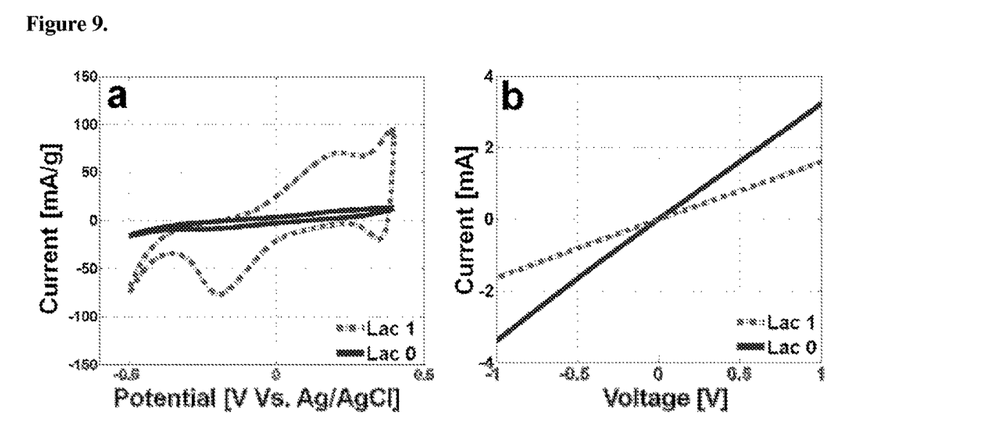
FIG. 9 shows (a) cyclic voltammograms of ITO-1 and ITO-3 and (b) current-voltage responses of two ITO/CuO/Au metal/semiconductor/metal devices, one containing ITO-1 and the other containing ITO-3.

More specifically, a VersaSTAT 3 potentiostat was used with a carbon fiber paper counter electrode and an Ag/AgCl reference electrode. The cyclic voltammetry sweeps were conducted in 1 M $NaSO_4$ aqueous electrolyte using a 20 mV/s scan rate. FIG. 9(a) shows the cyclic voltammograms of both ITO-1 (i.e., Lac 0) and ITO-3 (i.e., Lac 1).

As shown in this figure, the anodic and cathodic peaks indicate the quasi-reversible electron transfer process between $Cu^{2+}$ and $Cu^+$, which is the origin of the pseudo-capacitance of CuO. The specific capacitance of each film was calculated by taking the quotient of the average specific current and the potential scan rate. For detail about the calculation method, see also Dubal et al., *J. Alloys Compd.* 2010, 492, 26-30. Unexpectedly, ITO-3, grown in the presence of sodium lactate, exhibits a much larger specific capacitance (2700 mF/g) compared to that of ITO-1 (96 mF/g), which was prepared without adding any chelating agent to the SCBD solution. Therefore, adding a chelating agent such as sodium lactate to the SCBD solution results in a more amorphous CuO film, and thus a greater capacitance.

Also shown in FIG. 9 are current-voltage plots of two devices, one containing ITO-1 and the other containing ITO-3. These results are discussed in the electrical resistivity section below.

Electrical Resistivity

The electrical resistivity of each of ITO-1 and ITO-3 was measured by creating solid-state ITO/CuO/Au device stacks. More specifically, ~80 nm of gold was thermally evaporated through a shadow mask to define several Ohmic top contact pads (area of 0.092 $cm^2$) on top of the CuO film surface. A soft, eutectic gallium indium (EGaIn) liquid metal droplet was employed to make electrical contact to the top Au electrode. Current-voltage characteristics for the ITO/CuO/Au stacks were recorded using a Keithley 2602A sourcemeter. The thicknesses of the films were determined by tapping mode atomic force microscopy (AFM). Calculated resistivity values represent the average of four different ITO/CuO/Au junctions per CuO film. The results are shown in FIG. 9(b) above.

As shown in this figure, highly linear current-voltage characteristics were observed for both ITO-1 and ITO-3. Note that ITO-1 was prepared from the SCBD solution without sodium lactate and thus have a higher degree of crystallinity. Its resistivity value is $3.3\pm0.4\times10^5$ Ω·cm. ITO-3, grown from the SCBD solution containing sodium lactate and having a lower degree of crystallinity, exhibits a resistivity of $7.2\pm1.3\times10^5$ Ω·cm.

Note that the thicknesses of the CuO films in ITO-1 and ITO-3, determined by tapping mode atomic force microscopy, were 1180 nm and 992 nm, respectively.

Other Embodiments

All of the features disclosed in this specification may be combined in any combination. Each feature disclosed in this specification may be replaced by an alternative feature serving the same, equivalent, or similar purpose. Thus, unless expressly stated otherwise, each feature disclosed is only an example of a generic series of equivalent or similar features.

Indeed, based on the above disclosure, one skilled in the art can design a CuO semiconductor that has any combination of a substrate, a seed CuO layer, and a planted CuO layer. Further, the ratios among the components in a SCBD solution can be so engineered to prepare a CuO semiconductor of this invention that has the desired degree of crystallinity, morphology, bandgap, film thickness, bulk density, surface area, capacitance, and electrical resistivity.

From the above description, a skilled artisan can easily ascertain the essential characteristics of the present invention, and without departing from the spirit and scope thereof, can make various changes and modifications of the invention to adapt it to various usages and conditions. Thus, other embodiments are also within the scope of this invention.

What is claimed is:

1. A cupric oxide semiconductor comprising a substrate and a cupric oxide film overlaying the substrate, wherein the cupric oxide film, containing polycrystalline cupric oxide, amorphous cupric oxide, or both, has an electrical resistivity of 10 to $10^5$ Ω·cm, a thickness of 50 to 10000 nm, a bulk density of 1 to 6.4 g/cm$^3$, a surface area of 1 to 100 m$^2$/g, a bandgap of 1.1 to 1.8 eV, and a capacitance of 50 to 100000 mF/g.

2. The cupric oxide semiconductor of claim 1, wherein the polycrystalline cupric oxide and the amorphous cupric oxide constitute 5 to 95 wt % and 95 to 5 wt % of the cupric oxide film, respectively.

3. The cupric oxide semiconductor of claim 1, wherein the cupric oxide film includes a seed layer and a planted layer, the seed layer having a first side and a second side, the first side being in contact with the substrate, and the second side being in contact with the planted layer, in which the seed layer has a thickness of 10 to 5000 nm and contains dispersed cupric oxide crystals each having a diameter of 10 to 150 nm, and the planted layer has a thickness of 10 to 10000 nm and contains interconnected nanoplatelets or dendrite spheres of cupric oxide crystals each having a diameter of 10 to 500 nm.

4. The cupric oxide semiconductor of claim 1, further comprising a dopant in the cupric oxide film.

5. The cupric oxide semiconductor of claim 4, wherein the dopant is Li$^+$, Ag$^+$, Al$^{3+}$, Mn$^{2+}$, Mn$^{4+}$, Ga$^{3+}$, or a combination thereof, and the molar ratio between the dopant and the cupric oxide is 0.00001:1 to 0.1:1.

6. The cupric oxide semiconductor of claim 1, wherein the substrate is a metal, a glass, an alumina-containing material, or a silicon-containing material.

7. A photovoltaic device comprising:
a p-type absorber layer formed of a cupric oxide semiconductor of claim 1 containing a cupric oxide film,
a first electrode in ohmic contact with the p-type absorber layer,
an n-type layer coated on the cupric oxide film, and
a second electrode in ohmic contact with the n-type layer.

8. An energy storing device comprising
a first semiconductor layer formed of a cupric oxide semiconductor of claim 1,
a second semiconductor layer,
a separator that separates the first semiconductor layer and the second semiconductor layer, and
an electrolyte that is capable of passing through the separator and is in contact with both layers.

* * * * *